United States Patent [19]

Imakura

[11] Patent Number: 5,619,201
[45] Date of Patent: Apr. 8, 1997

[54] ANALOG/DIGITAL CONVERTER

[75] Inventor: Tatsuya Imakura, Itami, Japan

[73] Assignee: Mitsubishi Denki Kabushiki Kaisha, Tokyo, Japan

[21] Appl. No.: 324,632

[22] Filed: Oct. 18, 1994

[30] Foreign Application Priority Data

Nov. 2, 1993 [JP] Japan ................................ 5-274393

[51] Int. Cl.[6] .................................................. H03M 1/12
[52] U.S. Cl. ........................................... 341/141; 341/155
[58] Field of Search ...................................... 341/141, 155

[56] References Cited

U.S. PATENT DOCUMENTS

| | | | |
|---|---|---|---|
| 4,618,348 | 10/1986 | Parfitt | 34/141 |
| 4,654,632 | 3/1987 | Yoshida et al. | 341/141 |
| 5,172,116 | 12/1992 | Noma | 341/141 |
| 5,212,483 | 5/1993 | Wakimoto | 341/141 |
| 5,291,197 | 3/1994 | Abe | 341/141 |
| 5,293,167 | 3/1994 | Campbell, Jr. et al. | 341/141 |
| 5,331,324 | 7/1994 | Nakajima | 341/141 |

FOREIGN PATENT DOCUMENTS

| | | |
|---|---|---|
| 4305046/A1 | 9/1993 | Germany . |
| 63-262716 | 10/1988 | Japan . |
| 1-147618 | 6/1989 | Japan . |
| 1-174120 | 7/1989 | Japan . |

*Primary Examiner*—Marc S. Hoff
*Attorney, Agent, or Firm*—Lowe, Price, LeBlanc & Becker

[57] ABSTRACT

An analog/digital converter has a register which stores data for selecting an analog voltage to be scanned from analog voltages of plural channels, another register which stores data for selecting an analog voltage to be temporarily scanned, and a counter which is set to count a predetermined number of scanning cycles of the analog voltages. In the converter, analog voltages of plural channels can adequately be scanned by a simple configuration, and, in the course of continuously conducting the scan operation, analog voltages of channels other than the currently scanned channels can temporarily be scanned, so that the analog voltages are converted into digital values.

6 Claims, 14 Drawing Sheets

FIG. 2
PRIOR ART

| b0 | b1 | LOOP | b2 | SCAN GROUP | SCAN SEQUENCE |
|---|---|---|---|---|---|
| 0 | 0 | LOOP L0 | 0,1 | — | $AN_m \to AN_m \to AN_m \to AN_m$ (m=0~7) |
| 1 | 0 | LOOP L1 | 0 | GROUP Ga | $AN_0 \to AN_1$ |
|   |   |   | 1 | GROUP Gb | $AN_4 \to AN_5$ |
| 0 | 1 | LOOP L2 | 0 | GROUP Ga | $AN_0 \to AN_1 \to AN_2$ |
|   |   |   | 1 | GROUP Gb | $AN_4 \to AN_5 \to AN_6$ |
| 1 | 1 | LOOP L3 | 0 | GROUP Ga | $AN_0 \to AN_1 \to AN_2 \to AN_3$ |
|   |   |   | 1 | GROUP Gb | $AN_4 \to AN_5 \to AN_6 \to AN_7$ |

ANALOG/DIGITAL CONVERTER

BACKGROUND OF THE INVENTION

1. Field of the Invention

The invention relates to an analog/digital converter, and more particularly proposes an analog/digital converter which scans analog voltages of plural channels to convert them into digital values.

2. Description of Related Art

FIG. 1 is a block diagram showing the configuration of a prior art analog/digital converter. An analog/digital control register (hereinafter, abbreviated as "A/D control register") 1 including group selection bits $b_0$, $b_1$, and $b_2$ is connected to a data bus DB, and also to an analog/digital control circuit (hereinafter, abbreviated as "A/D control circuit") 2. The A/D control circuit 2 conducts controls such as selection of channels, one-shot scan mode, continuous scan mode, and output of an interrupt signal. Analog input terminals $AN_0$–$AN_7$ of plural channels which are to be subjected to the analog/digital conversion are coupled to the one input terminal of a comparator 7 through a selector 8 which selects one of the analog input terminals.

A digital/analog converter (hereinafter, abbreviated as "D/A converter") 6 to which a reference voltage $V_{ref}$ and ground potential $V_{ss}$ are applied outputs an analog voltage $V_{AN}$. The analog voltage $V_{AN}$ is supplied to the ow}aid input terminal of the comparator 7. A comparison result which is an output of the comparator 7 is supplied to the A/D control circuit 2. The A/D control circuit 2 outputs a selection signal $S_{SL}$ for selecting one of analog voltages, and a comparison result signal $S_{CP}$. The selection signal $S_{SL}$ is supplied to the selector 8, and the comparison result signal $S_{CP}$ to an analog/digital successive approximation register (hereinafter, abbreviated as "A/D successive approximation register") 5. The A/D successive approximation register 5 is connected to the D/A converter 6 and an analog/digital scan data register (hereinafter, abbreviated as "A/D scan data register") 3 which is a register for storing digital values that have been obtained by the A/D conversion in a scan mode.

The A/D successive approximation register 5 is connected also to the data bus DB so that data can be written into and read out from the register. The A/D scan data register 3 is connected to the data bus DB. Every time the A/D conversion or the scan operation is terminated, an analog/digital scan conversion termination interrupt signal (hereinafter, abbreviated as "A/D interrupt signal") $S_A$ is output.

Next, the operation of the analog/digital converter will be described with reference to FIG. 2 which shows contents of the scan mode.

An initial data is supplied through the data bus DB to the A/D successive approximation register 5, and written thereinto. The written initial data is then supplied to the D/A converter 6 which in turn compares in level a voltage due to the initial data with the reference voltage $V_{ref}$ to convert the digital value into an analog voltage. The converted analog voltage $V_{AN}$ is supplied to the comparator 7.

In the case where, for example, "0", "0" and "0" are written into the A/D control register 1 including the group selection bits $b_0$, $b_1$, and $b_2$, first, the A/D control circuit 2 reads out data of selected bits. The A/D control register 1 is designed so that either of data "0" or "1" is supplied to the group selection bits $b_0$, $b_1$, and $b_2$. As shown in FIG. 2, the scan sequence is decided in accordance with the combination of the group selection bits $b_0$, $b_1$, and $b_2$. As a result of reading out the data, the scan object channel is fixed to the same channel, and the selection signal $S_{SL}$ for selecting, for example, the analog input terminal $AN_0$ is supplied to the selector 8. This causes the selector 8 to operate so as to select the analog input terminal $AN_0$, and the analog voltage of the selected analog input terminal $AN_0$ is supplied to the comparator 7.

Then the comparator 7 compares in level the analog voltage of the analog input terminal $AN_0$ with the analog voltage $V_{AN}$. The comparison result is supplied to the A/D control circuit 2, and the comparison result signal $S_{CP}$ from the control circuit is supplied to the A/D successive approximation register 5 to be stored thereinto. Data stored in the A/D successive approximation register 5 are supplied to the D/A converter 6. The D/A converter 6 compares in level a voltage due to the data with the reference voltage $V_{ref}$, and the analog voltage $V_{AN}$ obtained as a result of the D/A conversion is supplied to the comparator 7. Then the comparator 7 compares the analog voltage $V_{AN}$ with the analog voltage of the analog input terminal $AN_0$, and sends the comparison result to the A/D control 2. The comparison result signal $S_{CP}$ is again supplied from the A/D control circuit 2 to the A/D successive approximation register 5 to be stored thereinto.

The above-mentioned operation is repeated so that the analog voltage of the analog input terminal $AN_0$ is converted into a digital value of a given bit number. After the conversion of the voltage into data of a given bit number is terminated, data stored in the A/D successive approximation register 5 are supplied to the A/D scan data register 3 to be stored thereinto. At the same time, the A/D control circuit 2 outputs the interrupt signal $S_A$, and the selection signal $S_{SL}$ is extinguished so that the selector 8 enters the state where the analog input terminal $AN_0$ is not selected.

Then the selection signal $S_{SL}$ is again supplied from the A/D control circuit 2 to the selector 8. The selector 8 selects the analog input terminal $AN_0$, and the selected analog voltage is converted into a digital value of a given bit number in the same manner as described above. The digital value is stored into the A/D scan data register 3. In this way, in the case where "0", "0", and "0" are written into the A/D control register including the group selection bits $b_0$, $b_1$, and $b_2$, the analog input terminal $AN_0$ is repeatedly scanned, and a scanned analog voltage is converted into a digital value of a given bit number. Also in the case where "0", "0", and "1" are respectively written at the group selection bits $b_0$, $b_1$, and $b_2$, the same operation is conducted.

When "0", "1", and "0" are written into the A/D control register including the group selection bits $b_0$, $b_1$, and $b_2$, for example, a loop $L_2$ is selected and a scan group Ga of the selected loop is selected so that the scan sequence is set to be the sequence of the analog input terminals $AN_0$, $AN_1$, and $AN_2$. In the same manner as described above, this causes the analog input terminal $AN_0$ to be first selected. The selected analog voltage is converted into a digital value of a given bit number, and the digital value is stored into the A/D scan data register 3.

Next, the selection signal $S_{SL}$ is changed so that the selector 8 selects the analog input terminal $AN_1$. The analog voltage of the analog input terminal $AN_1$ is converted into a digital value of a given bit number, and the digital value is stored into the A/D scan data register 3. The selection signal $S_{SL}$ is again changed so that the selector 8 selects the analog input terminal $AN_2$. The analog voltage of the analog input terminal $AN_2$ is converted into a digital value of a given bit number, and the digital value is stored into the A/D scan data register 3. At the time each scan operation is terminated, the A/D control circuit 2 outputs the interrupt signal $S_A$.

As shown in FIG. 2, in the case where the contents of the A/D control register including the group selection bits $b_0$, $b_1$, and $b_2$, are "1", "0", and "0", the scan operation is conducted in the sequence of the analog input terminals $AN_1$ and $AN_2$. Similarly, the scan operation is conducted in following sequences: the sequence of the analog input terminals $AN_4$, and $AN_5$ in the case of "1", "0", and "1"; the sequence of the analog input terminals $AN_0$, $AN_1$, and $AN_2$ in the case of "0", "1", and "0"; the sequence of the analog input terminals $AN_4$, $AN_5$, and $AN_6$ in tile case of "0", "1", and "1"; the sequence of the analog input terminals $AN_0$, $AN_1$, and $AN_2$, and $AN_3$ in the case of "1", "1", and "0"; and the sequence of the analog input terminals $AN_4$, $AN_5$, and $AN_6$ and $AN_7$ in the case of "1", "1", and "1". In other words, one of the seven kinds of the scan sequences of analog voltages can be selected depending on the value of the A/D control register including the group selection bits $b_0$, $b_1$, and $b_2$.

Japanese Application Laid-Open No. 1-147618 (1989) discloses a similar analog/digital converter. FIG. 3 is a block diagram showing the configuration of the analog/digital converter. A priority channel register group 31 stores data for deciding the priority of channels to which a conversion request is issued in the scan mode. The priority channel register group 31 is connected to a register selector 34 which is connected to a signal selector 39 through a channel bus 38. A Conversion request circuit 32 consists of an autoscan register 32a, and a conversion request register 32b.

Registers of the priority channel register group 31 are connected in an arrangement corresponding to that of the autoscan register 32a of the conversion request circuit 32. The conversion request register 32b of the conversion request circuit 32 is connected to a priority decision circuit 33 which is connected through buses totaling m to the register selector 34. A termination signal is supplied to the conversion request circuit 32, and the priority decision circuit 33 outputs a conversion start signal. The priority channel register group 31, the register selector 34, the conversion request circuit 32, and the priority decision circuit 33 constitute a conversion control circuit 30. The conversion control circuit 30 is connected to a control bus 35, an address bus 36, and a data bus 37.

The analog/digital converter can decide the priority of the channels by means of the priority channel register group 31. In the autoscan register 32a of the conversion request circuit 32, the bits of channels to be subjected to the A/D conversion are previously set to be "1" by a CPU which is not shown. In the conversion request register 32b, an interrupt from the CPU takes place and the bits of channels to be subjected to the A/D conversion are set to be "1". The priority decision circuit 33 selects the bit of the highest priority from the preset bits set in the conversion request register 32b. The register selector 34 selects the register corresponding to the bit number which is selected by the priority decision circuit 33, and sends the selected bit number through the channel bus 38 to the signal selector 39.

The priority of the A/D conversion channels which are selected by the autoscan register 32a is previously set in the priority channel register group 31. A channel to be converted is set in the conversion request register by the priority decision circuit 33, and then subjected to the A/D conversion. When an interrupt takes place during a conversion of a channel of a low priority, generally, the priority decision circuit 33 refers to the priority channel register group 31 and sets the conversion request register so that the channel to which a conversion request is issued is converted. Then the conversion which is currently conducted is aborted and the conversion of a channel of a higher priority is conducted.

Japanese Application Laid-Open No. 1-147618 (1989) discloses also an analog/digital converter in which the degree of freedom of the input selection in the scan mode is realized. Japanese Application Laid-Open No. 1-174120 (1989) discloses an analog/digital converter in which the scan sequence is decided by using outputs of a counter and a shift register. Japanese Application Laid-Open No. 63262716 (1988) discloses an analog/digital converter which comprises a FIFO scan register for obtaining the degree of freedom of the selection of analog voltages, and a register for the conversion step number.

As described above, in the scan mode operation of the prior art analog/digital converter shown in FIG. 1, analog voltages are converted into digital values only in the scan sequence of the analog voltages which is decided for a selected scan group, and the scan sequence cannot be changed during the scan operation. In other words, the degree of freedom of the selection of analog voltages of plural channels is low.

In the analog/digital converter of FIG. 3 which is disclosed in Japanese Application Laid-Open No. 1147618 (1989), the pattern of the conversion sequence of temporary conversion requests is previously set, and therefore a priority channel register corresponding to the pattern is required so that the converter is enlarged in size and complicated in configuration. When the scan operation is to be conducted in a pattern other than the preset one, a complicated control is required.

The analog/digital converter disclosed in Japanese Application Laid-Open No. 1-174120 (1989) cannot cope with a process which is to be conducted in response to an interrupt for temporarily converting analog voltages, and requires the means for storing the scan patterns. The analog/digital converter disclosed in Japanese Application Laid-Open No. 63-262716 (1988) requires many registers.

SUMMARY OF THE INVENTION

The invention has been conducted in order to solve the above-discussed problems. It is an object of the invention to provide an analog/digital converter in which analog voltages of plural channels can adequately be scanned by a simple configuration, and, in the course of continuously conducting the scan operation, analog voltages of channels other than currently scanned channels can temporarily be scanned so that the analog voltages are converted into digital values.

The analog/digital converter according to the invention comprises a register for selecting an analog voltage to be scanned for each of plural channels, and a counter which counts repetitions of a scan loop in which a cycle of scanning the selected analog voltage is done.

The analog voltage selected by the register is scanned and the counter counts repetitions of a scan loop in which a cycle of a scan operation is done. Therefore, the analog voltage to be scanned and the number of scan operations can be separately selected.

The analog/digital converter according to the invention comprises a first register for selecting an analog voltage to be scanned for each of plural channels, and a second register for selecting an analog voltage to be temporarily scanned for each of the channels.

When the analog voltage is selected by the second register, the analog voltage selected by the first register and that selected by the second register are scanned. Therefore, desired analog voltages can temporarily be scanned to be converted into digital values.

The analog/digital converter according to the invention comprises a first register for selecting an analog voltage to be scanned for each of plural channels, a second register for selecting an analog voltage to be temporarily scanned for each of the channels, and a counter which counts repetitions of a scan loop in which a cycle of scanning the analog voltage selected by the second register is done.

Analog voltages selected by the first and second registers are scanned. When the count value of the scan loops reaches a preset value, the second register stops the selection of the analog voltage, and only the analog voltage selected by the first register is scanned. Therefore, the number of scanning cycles for the analog voltages to be temporarily scanned can be selected.

The analog/digital converter according to the invention comprises a register for selecting an analog voltage to be scanned for each of a plurality of channels, and a counter which counts the number of scanning cycles for the analog voltage to be temporarily scanned.

The preset value of the counter is given in accordance with the analog voltage to be selected, and the selected analog voltage is scanned by a number corresponding to the preset value. Therefore, the number of scanning cycles for the analog voltage to be temporarily scanned can be selected for each of analog voltages of different channels.

The analog/digital converter according to the invention comprises a first register for selecting an analog voltage to be scanned for each of a plurality of channels, a second register for selecting an analog voltage to be temporarily scanned for each of the channels, and a signal input terminal which is connected to the second register, and to which an external signal is input.

When a signal is input to the signal input terminal, the second register selects the analog voltage. In accordance with an external input, therefore, the analog voltage can temporarily be scanned.

The analog/digital converter according to the invention comprises a register for selecting an analog voltage to be scanned for each of a plurality of channels, a counter in which the number of scan loops of the analog voltage to be temporarily scanned is set, and which counts the scan loops, a signal input terminal to which an external signal is input, and a reload register which transfers data to the counter.

When a signal is input to the signal input terminal, the reload register transfers data to the counter. Therefore, the preset value can be input to the counter from the outside, and the number of cycles for temporarily scanning the analog voltage can be selected.

The analog/digital converter according to the invention comprises a first register for selecting an analog voltage to be scanned for each of plural channels, a second register for selecting an analog voltage to be temporarily scanned for each of the channels, a counter in which the number of scan loops of the analog voltage to be temporarily scanned is set, and which counts the scan loops, and a reload register which transfers a given value to the counter.

When the second register is cleared, data of the reload register are transferred to the counter. When the count value of the counter reaches a given value, the operation of scanning the analog voltage selected by the second register is stopped. Therefore, the number of cycles for temporarily scanning the analog voltage can be selected, and the given value can be sent to the counter from the outside.

The above and further objects and features of the invention will more fully be apparent from the following detailed description with accompanying drawings.

BRIEF DESCRIPTION OF THE DRAWINGS

FIG. 2 is a diagram illustrating write contents of a prior art A/D control register and scan sequences;

DESCRIPTION OF THE PREFERRED EMBODIMENTS

The invention will be described in detail with reference to the drawings showing its embodiments.

Embodiment 1

Figure 1:
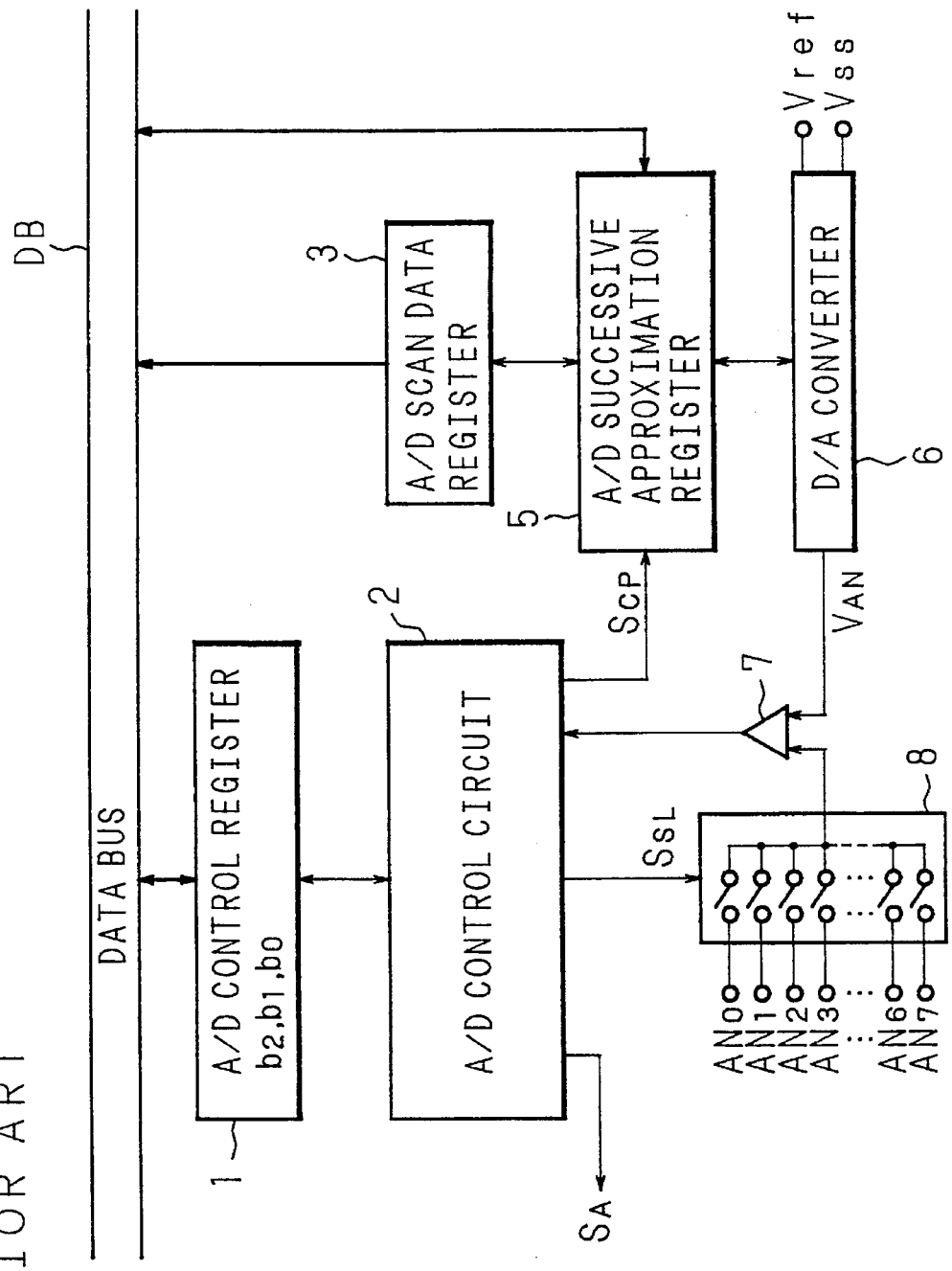
FIG. 1 is a block diagram showing the configuration of a prior art analog/digital converter.
Figure 3:
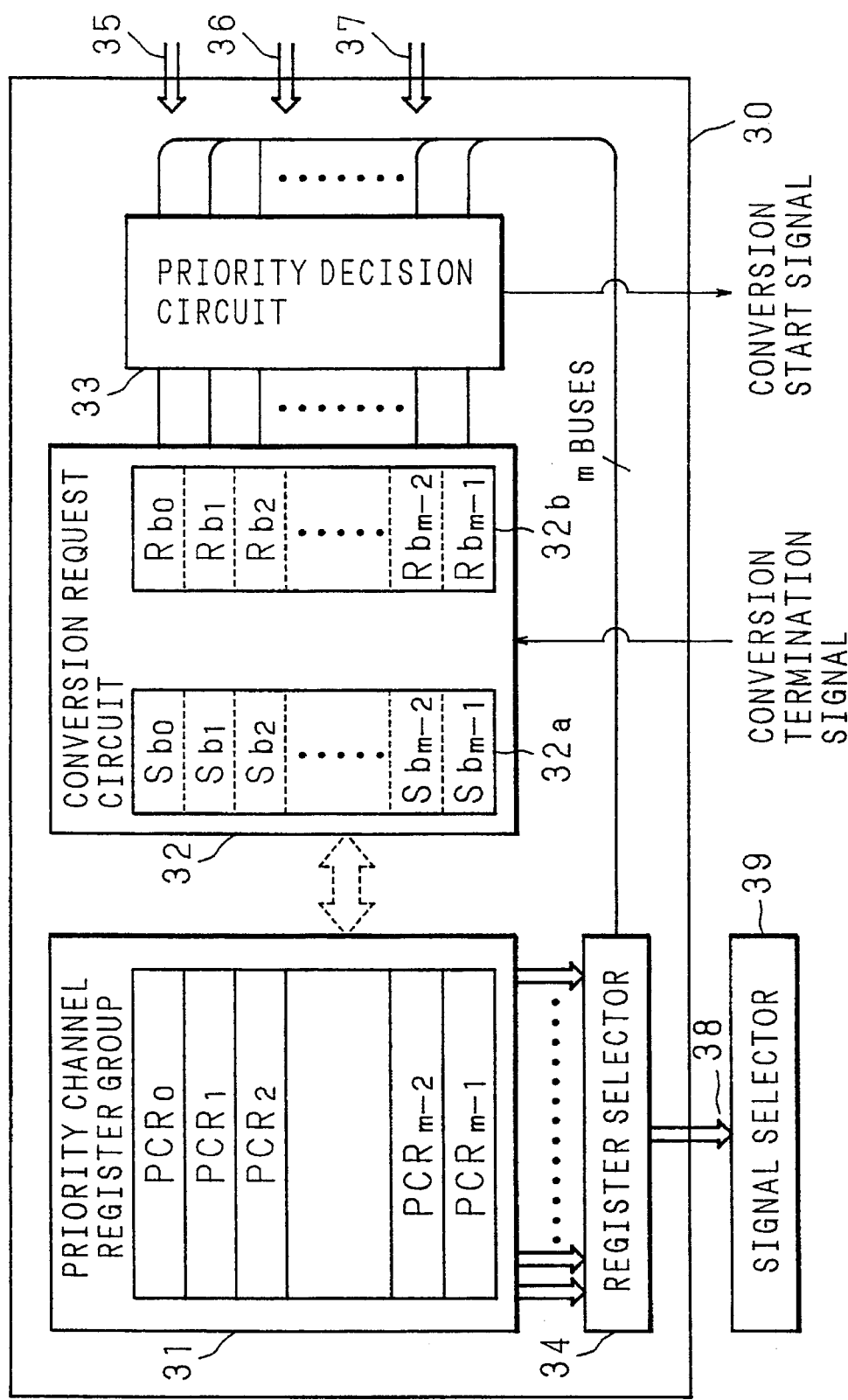
FIG. 3 is a block diagram showing the configuration of another prior art analog/digital converter.
Figure 4:
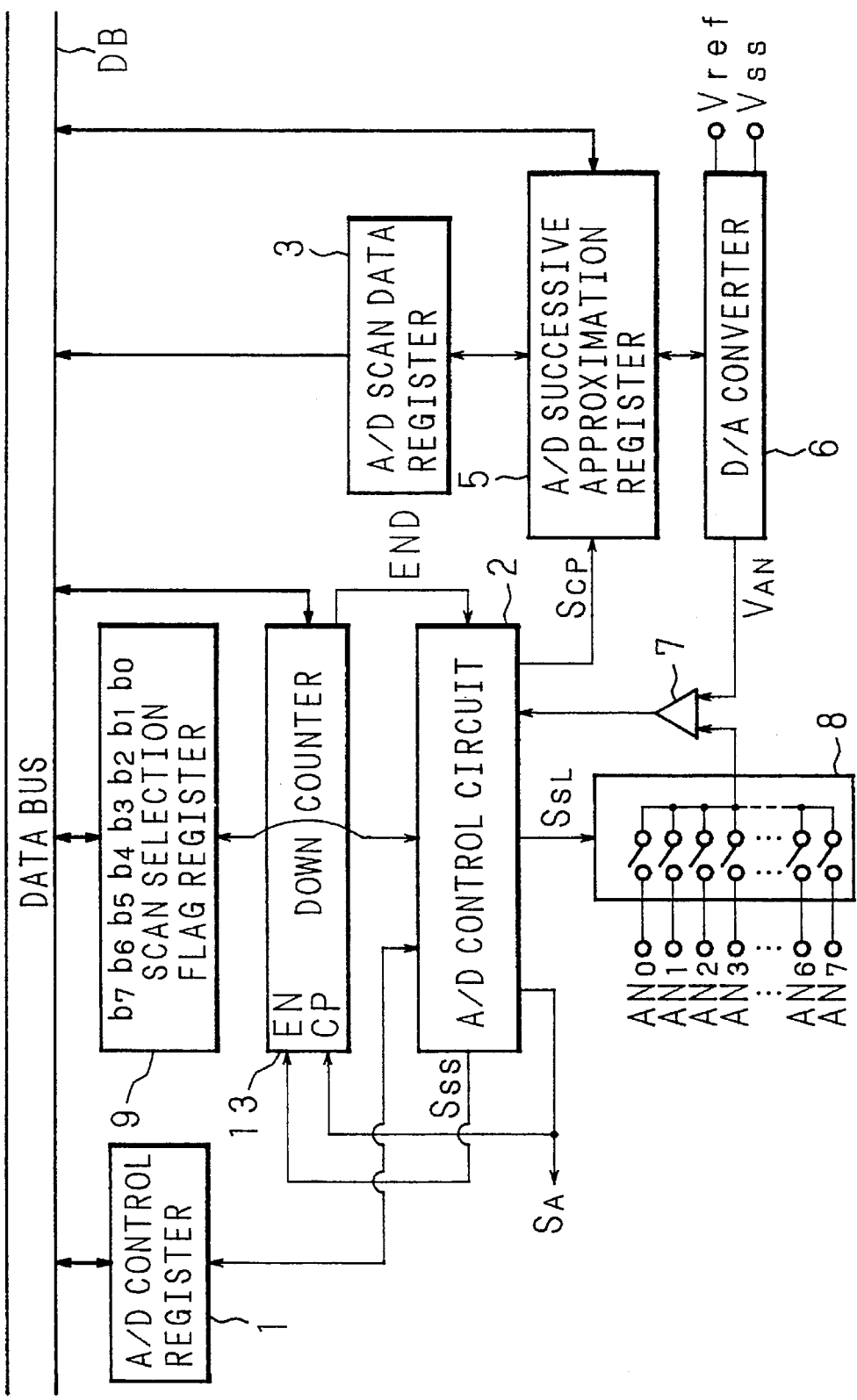
FIG. 4 is a block diagram showing the configuration of Embodiment 1 of the analog/digital converter according to the invention.

FIG. 4 is a block diagram showing the configuration of Embodiment 1 of the analog/digit.al converter according to the invention. An A/D control register 1 is connected to a data bus DB, and also to an A/D control circuit 2. A scan selection flag register 9 has bits $b_0$, $b_1$, $b_2$, $b_3$, $b_4$, $b_5$, $b_6$, and $b_7$ respectively corresponding to analog input terminals $AN_0$–$AN_7$ which will be described later. The scan selection flag register 9 is connected to the data bus DB, and also to the A/D control circuit 2.

A down counter 13 is connected to the data bus DB so that a preset value can be written into and read out from the down counter 13. A count termination signal END from the down counter 13 is supplied to the A/D control circuit 2. A scan start signal $S_{SS}$ output from the A/D control circuit 2 is supplied to an enable terminal EN of the down counter 13. An A/D interrupt signal $S_A$ output from the A/D control circuit 2 is supplied to a pulse input terminal CP of the down counter 13, and also to a control circuit which is not shown. Analog voltages of the analog input terminal $AN_0$–$AN_7$ which are to be subjected to the analog/digital conversion are input to the one input terminal of a comparator 7 through a selector 8 which selects one of the analog voltages.

A D/A converter 6 to which a reference voltage $V_{ref}$ and ground potential $V_{SS}$ are applied outputs an analog voltage $V_{AN}$. The analog voltage $V_{AN}$ is supplied to the other input terminal of the comparator 7. A comparison result which is output from the comparator 7 is supplied to the A/D control circuit 2. A selection signal $S_{SL}$ output from the A/D control circuit 2 is supplied to the selector 8, and a comparison result signal $S_{CP}$ corresponding to the comparison result is supplied to an A/D successive approximation register 5. The A/D successive approximation register 5 is connected to a D/A converter 6, an A/D scan data register 3 for storing the result which have been obtained by the A/D conversion in a scan mode, and to the data bus DB.

The A/D scan data register 3 is connected to the data bus DB so that data stored in the register are read out through the data bus DB. Each time one cycle of the scan operation is completed, the A/D control circuit 2 outputs an A/D interrupt signal $S_A$. The A/D control register 1 stores data for selecting the analog voltage of selected channel when the scan operation is not conducted. Bits $b_0$ to $b_7$ of the scan selection flag register 9 store data for selecting the analog voltage of the analog input terminals $AN_0$–$AN_7$; in a scan mode whirl such as a one-shot scan mode or a continuous scan mode.

Figure 5:
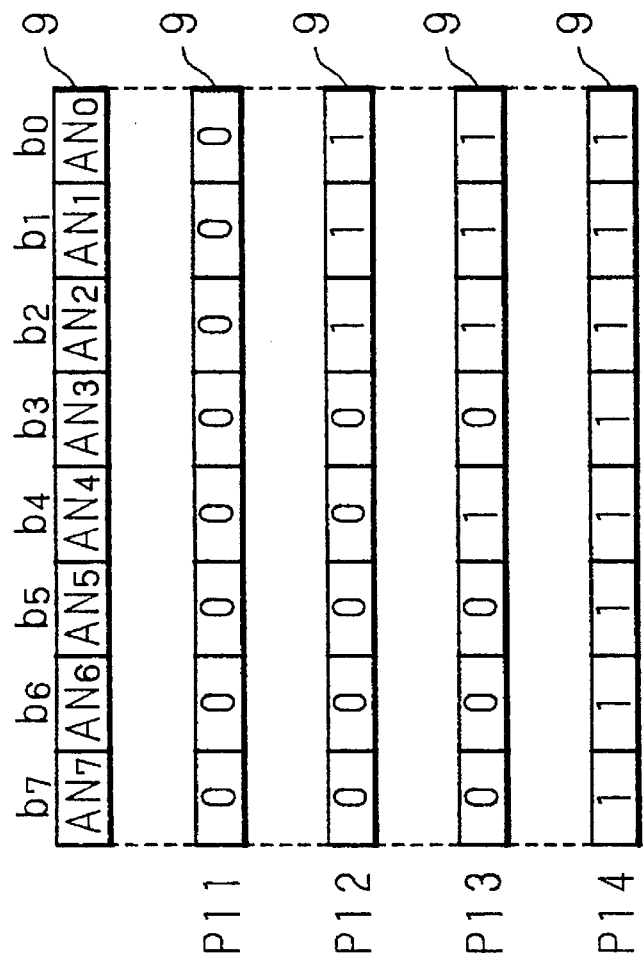
FIG. 5 is a diagram illustrating write contents of Embodiment 1 of a scan selection flag register, and those of scan loops.

Next, the operation of the analog/digital converter will be described with reference to FIG. 5 which shows write contents of the scan selection flag register 9, and those of scan loops.

An initial data is supplied through the data bus DB to the A/D successive approximation register 5, and written thereinto. The written initial data is then supplied to the D/A converter 6 which in turn compares in level the initial data with the reference voltage $V_{ref}$, to convert the digital value into an analog voltage. The converted analog voltage $V_{AN}$ is supplied to the comparator 7.

The comparator 7 compares in level the analog voltage selected by the selector 8 with the converted analog voltage $V_{AN}$. The comparison result is supplied to the A/D control circuit 2 which in turn outputs the comparison result signal $S_{CP}$. The comparison result signal $S_{CP}$ is supplied to the A/D successive approximation register 5 to be stored thereinto. Data stored in the A/D successive approximation register 5 are supplied to the D/A converter 6. The D/A converter 6 compares in level the input data with the reference voltage $V_{ref}$ and the analog voltage V obtained as a result of the D/A conversion is supplied to the comparator 7. Then the comparator 7 compares in level the dialog voltage $V_{AN}$ with the analog voltage selected by the selector 8, and sends the comparison result to the A/D control circuit 2. The comparison result signal $S_{CP}$ is again supplied from the A/D control circuit 2 to the A/D successive approximation register 5 to be stored thereinto.

The above-mentioned operation is repeated so that the analog voltage selected by the selector 8 is converted into a digital value of a given bit number. When bits $b_0$ to $b_7$ of the scan selection flag register 9 which are shown in FIG. 5 and respectively correspond to the channels of the analog input terminals $AN_0$–$AN_7$ are not selected, all bits $b_0$ to $b_7$ are set to be "0" as shown in pattern P11. When, as shown in pattern P12, a CPU which is not shown then writes "1" into bits $b_0$ $b_1$, and $b_2$ of the scan selection flag register 9, "0" into bits $b_3$–$b_7$ of the scan selection flag register 9, and, for example, "2" as a preset value into the down counter 13, the selector 8 selects the analog input terminals $AN_0$, $AN_1$, and $AN_2$ in this sequence in accordance with the selection signal $S_{SL}$ output from the A/D control circuit 2, thereby forming a scan loop of $AN_0$–$AN_1$–$AN_2$. Then the selected analog voltage is scanned to be converted into a digital value of a given bit number as described above.

When the scan operation is to be started, the A/D control circuit 2 issues the scan start signal $S_{SS}$ to the down counter 13, so that the down counter 13 enters the enabled state. Each time one cycle of the scan loop is completed, the A/D control circuit 2 supplies the A/D interrupt signal $S_A$ to the down counter 13. Each time the A/D interrupt signal $S_A$ is input into the down counter 13, the value of the down counter 13 is decremented so that, when two cycles of the scan loop are completed, the value of the counter becomes "0". Then the down counter 13 outputs the count termination signal END to the A/D control circuit 2. The A/D control circuit 2 controls the A/D conversion operation so as to be stopped.

As shown in pattern P13, thereafter, the CPU writes "1" into bits $b_0$, $b_1$, $b_2$, and $b_4$ of the scan selection flag register 9, and "0" into bits $b_3$, $b_5$, $b_6$, and $b_7$ of the scan selection flag register 9. The analog input terminals $AN_0$, $AN_1$, $AN_2$, and $AN_4$ are then selected in this sequence to form a scan loop of $AN_0$–$AN_1$–$AN_2$–$AN_4$. When two cycles of the scan loop are completed, the A/D conversion operation is stopped in the same manner as described above.

The CPU then writes "1" into bits $b_0$–$b_7$ of the scan selection flag register 9 as shown in pattern P14, and the analog input terminals $AN_0$ to $AN_7$ are selected in this sequence to form a scan loop of $AN_1$–$AN_1$–$AN_2$–$AN_3$–$AN_4$–$AN_5$–$AN_6$–$AN_7$. When two cycles of the scan loop are completed, the A/D conversion operation is stopped.

The above-mentioned preset value "2" of the down counter 13 should be considered as an example. When the scan operation is not to be conducted, the selection signal $S_{SL}$ corresponding to the data of the A/D control register 1 is supplied to the selector 8 so that a desired analog voltage is selected and a conversion is conducted only one time to convert the selected analog voltage into a digital value of a given bit number.

As described above, when the scan operation is to be started, "1" is written into selected bits of the scan selection flag register 9, whereby the analog voltage of a desired channel can be selected to be converted into a digital value. Furthermore, the cycle number of the scan loop can adequately be selected.

Embodiment 2

Figure 6:
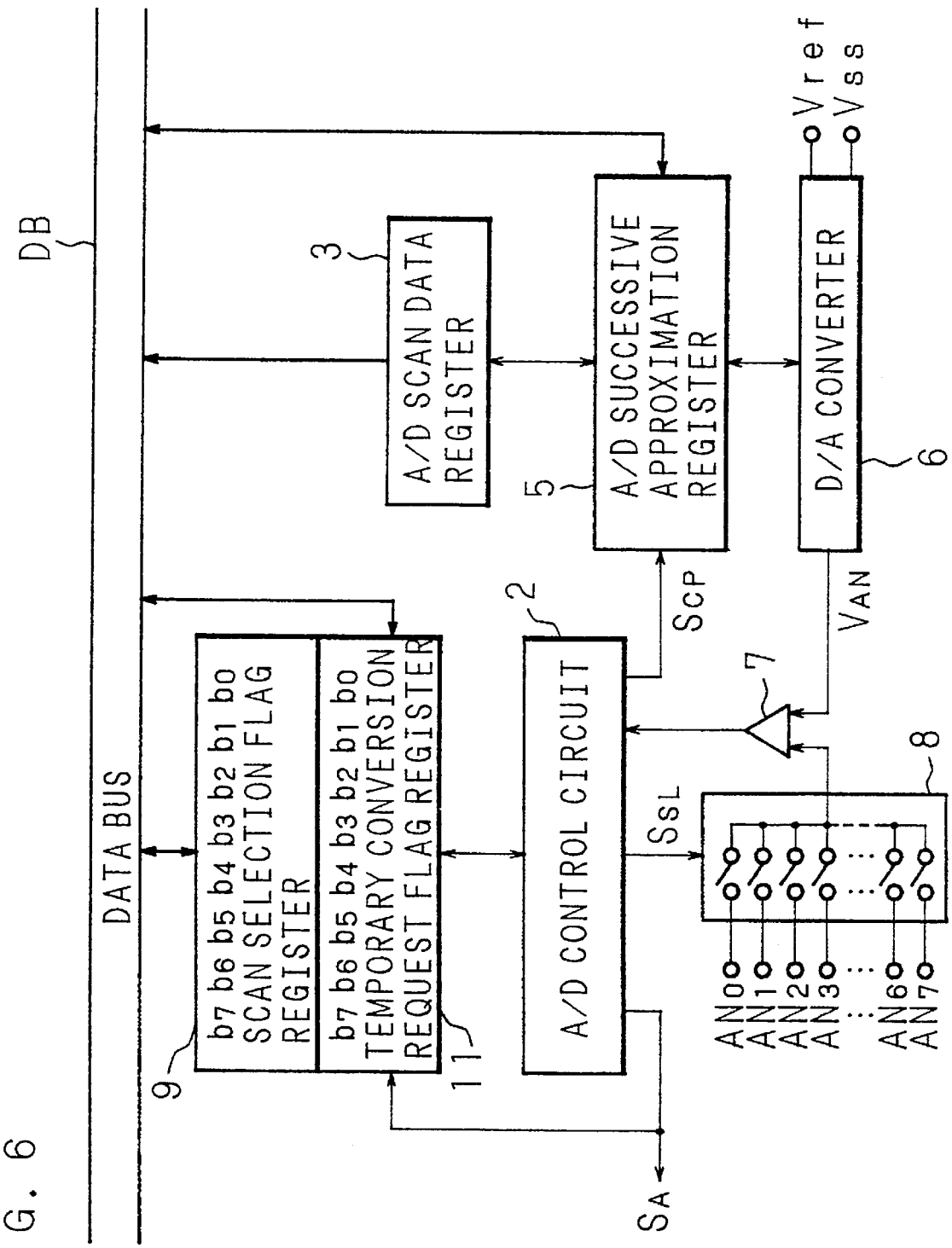
FIG. 6 is a block diagram showing t.he configuration of Embodiment 2 of the analog/digital converter according to the invention.

FIG. 6 is a block diagram showing the configuration of Embodiment 2 of the analog/digital converter according to the invention.

A scan selection flag register 9 having bits $b_0$–$b_7$ is connected to a data bus DB, and also to a temporary conversion request flag register 11 having bits $b_0$–$b_7$. The temporary conversion request flag register 11 is connected to an A/D control circuit 2. Bits $b_0$–$b_7$ of the temporary conversion request flag register 11 respectively correspond to analog input terminals $AN_0$–$AN_7$ of plural channels.

The temporary conversion request flag register 11 is connected to the data bus DB so that data for the register 11 can be written into and read out from the register. An A/D interrupt signal $S_A$ output from the A/D control circuit 2 is supplied to the temporary conversion request flag register 11. The other configuration is the same as that shown in FIG. 4 excluding the A/D control register 1. The same components are designated by the same reference numerals and their description is omitted.

Figure 7:
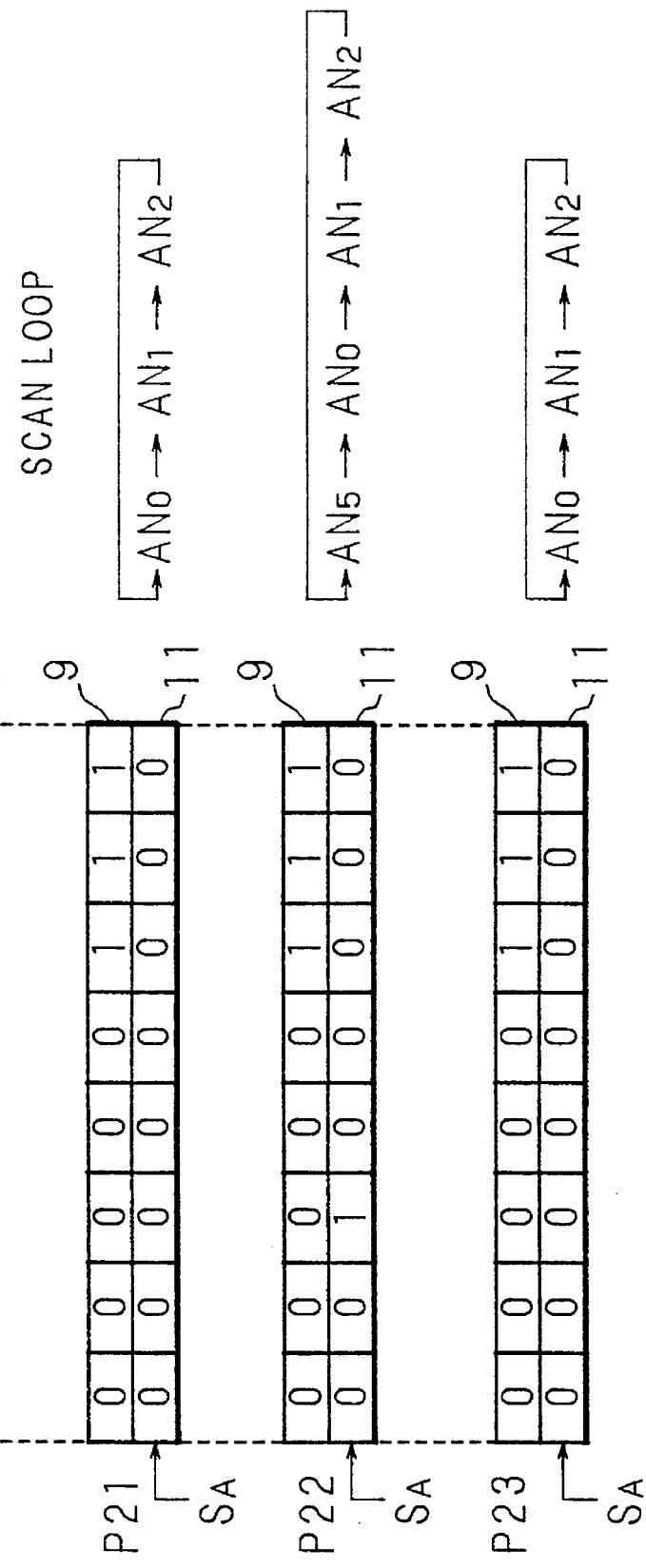
FIG. 7 is a diagram illustrating write contents of Embodiment 2 of a scan selection flag register and a temporary conversion request flag register, and those of scan loops.

Next, the operation of the analog/digital converter will be described with reference to FIG. 7 which shows write contents of the scan selection flag register 9 and the temporary conversion request flag register 11, and those of scan loops.

The conversion conducted by the A/D successive approximation register 5, the D/A converter 6, and the like are the same as those conducted in the converter of FIG. 4.

When, as shown in pattern P21, a CPU which is not shown writes "1" into bits $b_0$, $b_1$, and $b_2$ of the scan selection flag register 9, and "0" into bits $b_3$, $b_4$, $b_5$, $b_6$, and $b_7$ of the seen selection flag register 9, the A/D control circuit 2 outputs the selection signal $S_{SL}$ corresponding to data of bits $b_0$, $b_1$, and $b_2$, to the selector 8. The selector 8 then selects the analog input terminals $AN_0$, $AN_1$, and $AN_2$ corresponding to bits $b_0$, $b_1$, and $b_2$ in this sequence, thereby forming a seen loop of $AN_0$–$AN_1$–$AN_2$.

Then the selected analog voltage is converted into a digital value of a given bit number as described above. The scan loop is repeated until the CPU issues a stop command.

Each time one cycle of the scan loop is completed, the A/D control circuit 2 outputs the A/D interrupt signal $S_A$ to the temporary conversion request flag register 11, so that, as shown in pattern P21, bits $b_0$–$b_7$ of the temporary conversion request flag register 11 are reset to be "0".

When, as shown in pattern P22, the CPU writes "1" into bit b5 of the temporary conversion request flag register 11 during the execution of such a scan operation, the selection signal $S_{SL}$ from the A/D control circuit 2 is changed in the next scan loop so that analog voltages are scanned in the sequence of $AN_5$–$AN_0$–$AN_1$–$AN_2$. That is, $AN_5$ is temporarily selected to be added into the current scan loop of $AN_0$–$AN_1$–$AN_2$, and the analog voltage of the analog input terminal $AN_5$ is converted into a digital value of a given bit number.

When the scan loop of $AN_5$–$AN_0$–$AN_1$–$AN_2$ is terminated and the A/D interrupt signal $S_A$ is output, all bits $b_0$–$b_7$ of the temporary conversion request flag register 11 are reset as shown in pattern P21, and the temporary conversion request is canceled. As shown in pattern P23, thereafter, the state where "1" is written into only bits $b_0$, $b_1$, and $b_2$ of the scan selection flag register 9 is attained, and the scan operation is returned to the scan loop of $AN_0$–$AN_1$–$AN_2$.

In the embodiment, an example in which "1" is written into bit $b_5$ of the temporary conversion request flag register 11 has been described. Alternatively, "1" may be written into another bit or plural bits of the temporary conversion request flag register 11 in a similar manner. According to the alternative, while a scan loop of selecting analog voltages is formed in accordance with data of the scan selection flag register and the scan operation is conducted, the analog voltage of desired channel can be scanned temporarily to be converted into a digital value.

When one cycle of the scan loop including temporarily scanned analog voltages is completed, furthermore, the scan operation can be returned to the scan loop which is formed as a result of the selection by means of the scan selection flag register.

Embodiment 3

Figure 8:
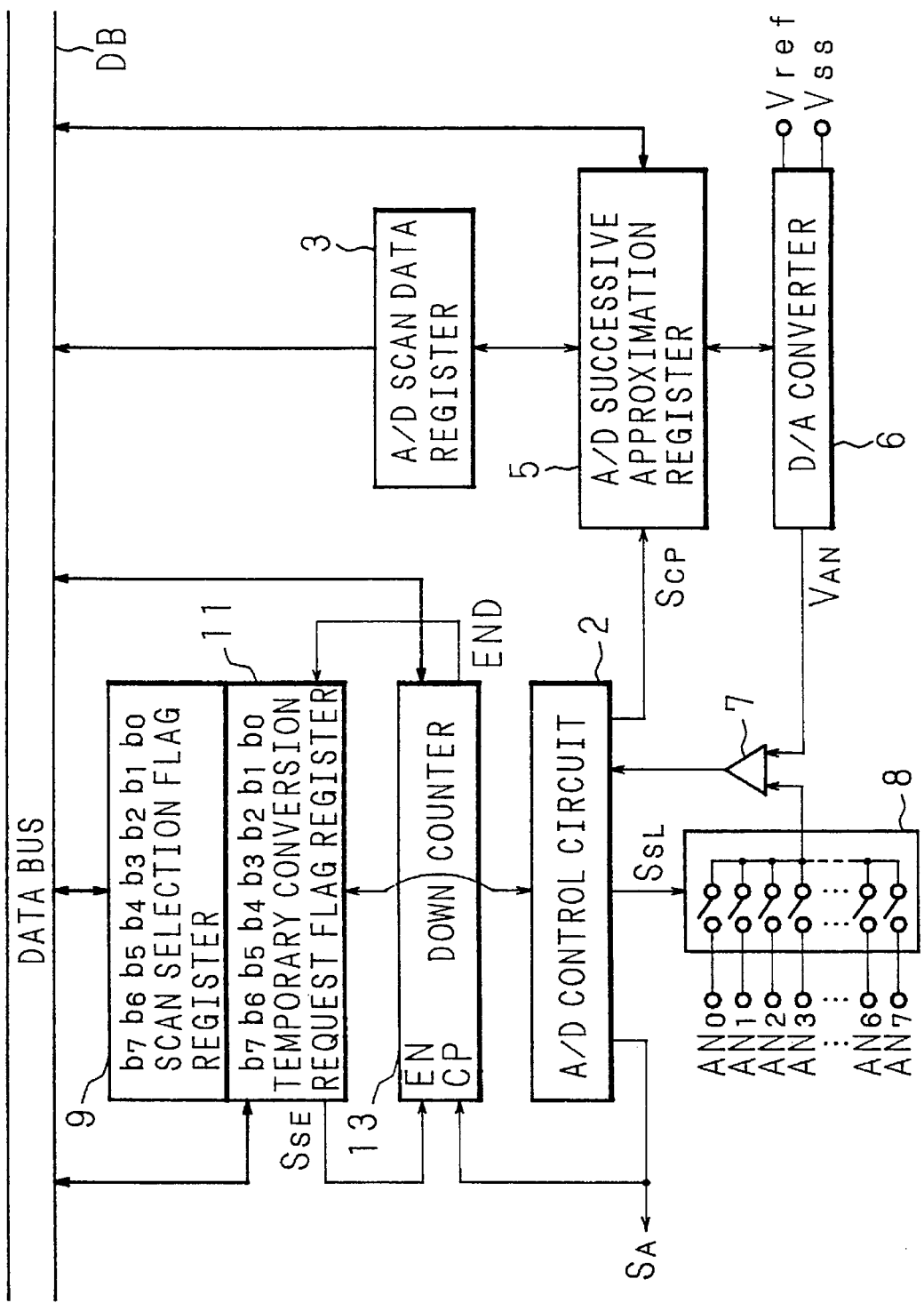
FIG. 8 is a block diagram showing the configuration of Embodiment 3 of the analog/digital converter according to the invention.

FIG. 8 is a block diagram showing the configuration of Embodiment 3 of the analog/digital converter according to the invention. A set termination signal $S_{SE}$ output from a temporary conversion request flag register 11 which is connected to an A/D control circuit 2 is given to an enable terminal EN of a down counter 13. A count termination signal END from the down counter 13 is supplied to the temporary conversion request flag register 11. An A/D interrupt signal $S_A$ output from the A/D control circuit 2 is supplied to a pulse input terminal CP of the down counter 13. The down counter 13 is connected to a data bus DB so that a preset value can be written into and read out from the down counter 13. The other configuration is the same as that of FIG. 6. The same components are designated by the same reference numerals and their description is omitted.

Figure 9:
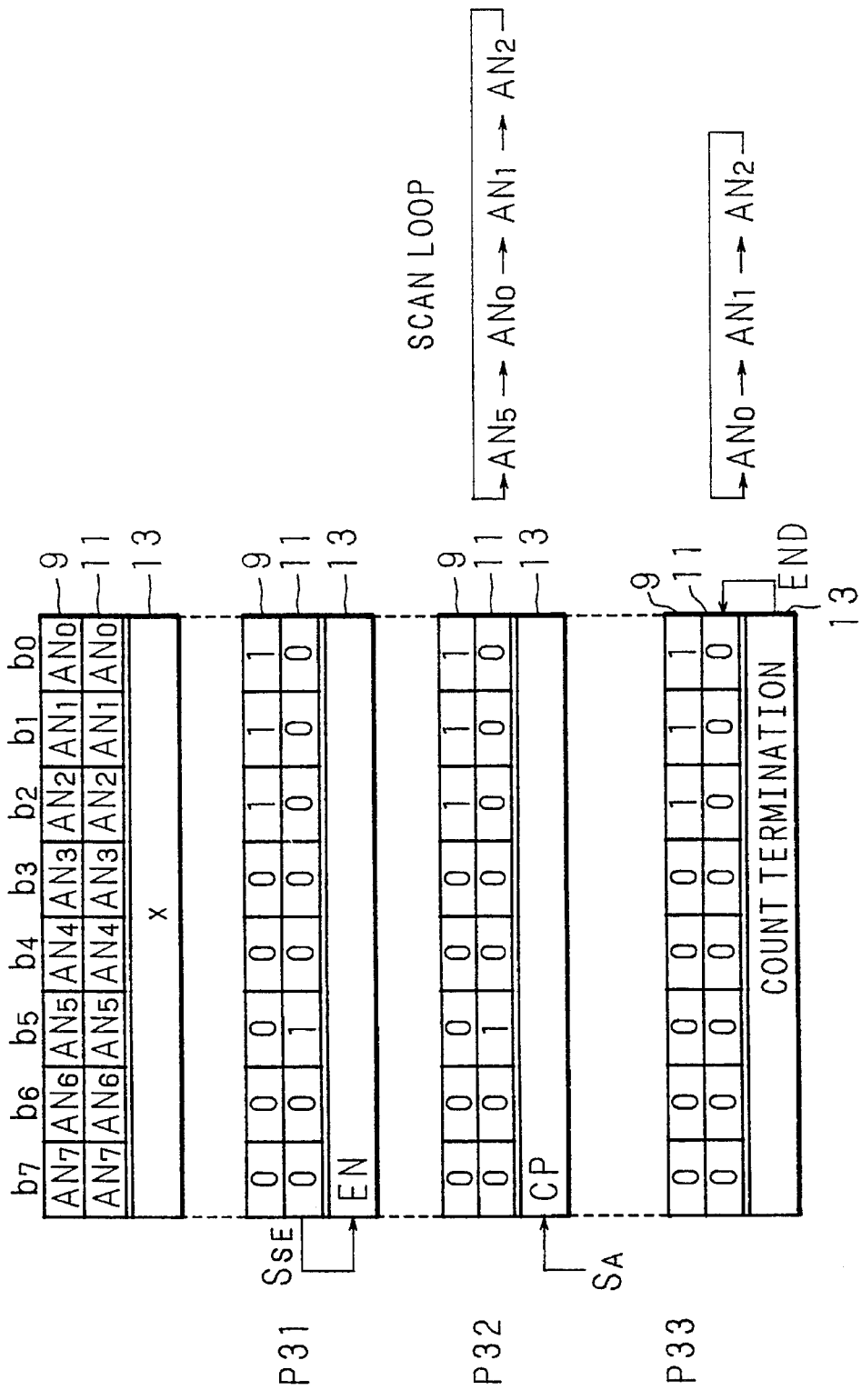
FIG. 9 is a diagram illustrating write contents of Embodiment 3 of a scan selection flag register and a temporary conversion request flag register, and those of scan loops.

Next, the operation of the analog/digital converter will be described with reference to FIG. 9 which shows write contents of the scan selection flag register 9 and the temporary conversion request flag register 11, and those of the scan loop operation.

The conversions conducted by the A/D successive approximation register 5, the D/A converter 6, and the like are the same as those conducted in the converter of FIG. 4.

As shown in pattern P31, "1" is written into bits $b_0$, $b_1$, and $b_2$ of the scan selection flag register 9, "0" is written into bits $b_3$–$b_7$ of the scan selection flag register 9, and a preset value x (x is a natural number which is 1 or more) is written into the down counter 13. The data written into the scan selection flag register 9 are sent to the A/D control circuit 2. The analog input terminals $AN_0$, $AN_1$, and $AN_2$ are selected in accordance with the selection signal SSL output. from the A/I) control circuit 2, thereby forming a scan loop. The analog voltages of the scanned analog input terminals $AN_0$, $AN_1$, and $AN_2$ are sequentially converted into digital values. The scan operation of the scan loop is repeated.

When one cycle of the scan loop is completed, an A/D interrupt signal $S_A$ is generated to be supplied to the down counter 13. When, as shown in pattern P32, a CPU which is not shown writes "1" into, for example, bit $b_5$ of the temporary conversion request flag register 11 during the execution of such a scan operation of the scan loop, the temporary conversion request flag register 11 outputs a flag set termination signal $S_{SE}$ after the writing is completed. The flag set termination signal $S_{SE}$ is given to the enable terminal EN of the down counter 13 so that the down counter 13 enters the enabled state. The above-mentioned writing of "1" into bit $b_5$ of the temporary conversion request flag register 11 causes a scan loop of $AN_5$–$AN_0$–$AN_1$–$AN_2$ to be formed as shown in pattern P32, and the analog input terminals $AN_5$, $AN_0$, $AN_1$, $AN_2$ are selected so that each of their analog voltages is converted into a digital value.

In response to the A/D interrupt signal $S_A$ which is generated each time one cycle of such a scan loop is completed, the value of the down counter 13 is decremented so that, when x cycles of the scan loop are completed, the down counter outputs the count termination signal END to the temporary conversion request flag register 11. Bits $b_0$–$b_7$ of the temporary conversion request flag register 11 are reset as shown in pattern P33, and the temporary conversion request is cancelled. Then the scan operation is returned to the scan loop of $AN_0$–$AN_1$–$AN_2$.

In this way, a scan loop in accordance with data written into the scan selection flag register 9 can be repeated. When a data is written into the temporary conversion request flag register 11 during the execution of such a scan operation, a scan loop in accordance with data of the scan selection flag register 9 and the temporary conversion request flag register 11 can be repeated an x number of times which is preset in the down counter 13. After a predetermined number of cycles of a scan loop in accordance with data of the temporary conversion request flag register 11 are completed, the scan operation can be returned to the scan loop in accordance with data of the scan selection flag register 9.
Embodiment 4

Figure 10:
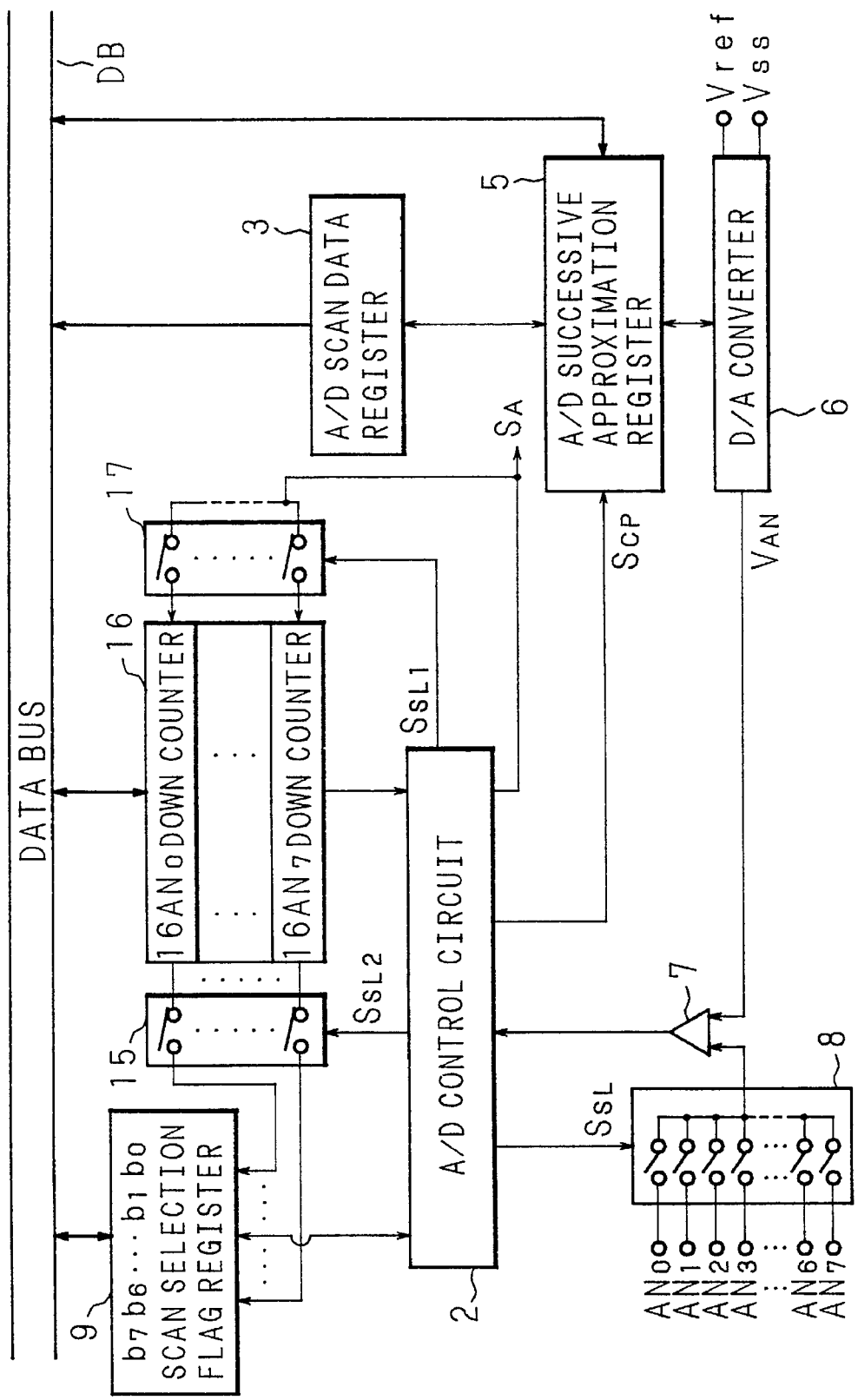
FIG. 10 is a block diagram showing the configuration of Embodiment 4 of the analog/digital converter according to the invention.

FIG. 10 is a block diagram showing the configuration of Embodiment 4 of the analog/digital converter according to the invention. Down counters 16 of $16AN_0$–$16AN_7$ which respectively correspond to analog input terminals $AN_0$–$AN_7$ of plural channels are connected to a data bus DB, and also to an A/D control circuit 2. An A/D interrupt signal $S_A$ output from the A/D control circuit 2 is supplied to the down counters 16 through a selector 17. A count termination signal END from each of the down counters 16 is supplied to a scan selection flag register 9 through a selector 15. The down counters 16, the selector 15, and the scan selection flag register 9 are disposed so as to respectively correspond to the analog input terminals $AN_0$–$AN_7$. The scan selection flag register 9 is connected to the data bus DB and the A/D control circuit 2. A selection signal $S_{SL1}$ output from the A/D control circuit 2 is supplied to the selector 17 so that one of the down counters 16 is selected.

A selection signal $S_{SL2}$ output from the A/D control circuit 2 is supplied to the selector 15 so that one of the count termination signals END output from the down counters 16 is selected. The other configuration is the same as that shown in FIG. 6 excluding the scan selection flag register 9 and the temporary conversion request flag register 11. The same components are designated by the same reference numerals.

Figure 11:
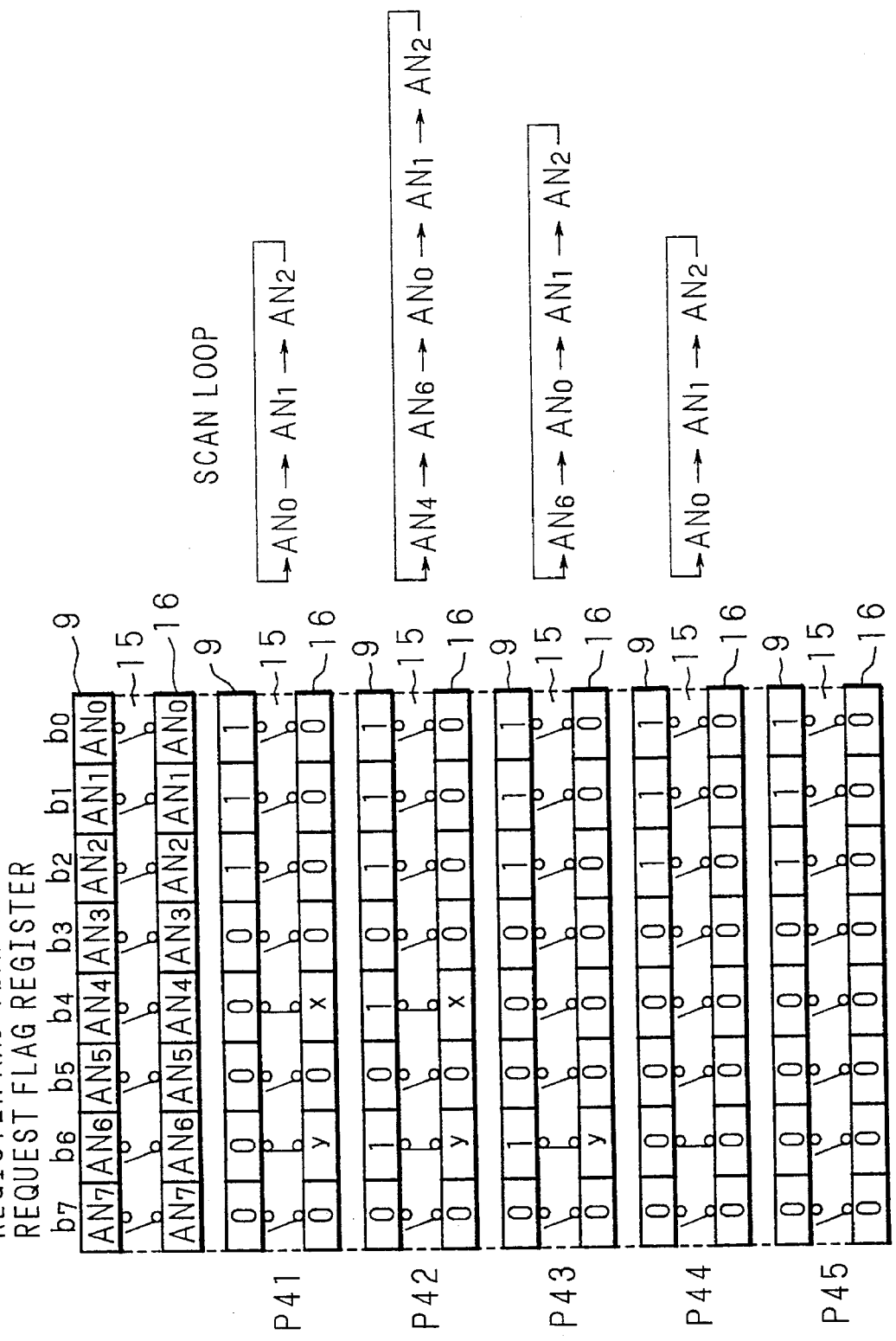
FIG. 11 is a diagram illustrating write contents of Embodiment 4 of scan selection flag register and a down counter, and those of scan loops.

Next, the operation of the analog/digital converter will be described with reference to FIG. 11 which shows write contents of the scan selection flag register 9 and the down counters 16, and those of scan operation.

The conversions conducted by the A/D successive approximation register 5, the D/A converter 6, and the like are the same as those conducted in the converter of FIG. 4.

When, as shown in pattern P41, "1" is written into bits $b_0$, $b_1$, and $b_2$ of the scan selection flag register 9, the selector 8 selectively operates in accordance with the data of the scan selection flag register 9, so that a scan loop for scanning the analog input terminals $AN_0$, $AN_1$, and $AN_2$ is formed. When a temporary conversion request is issued during the scan operation and, for example, preset values of x and y are written into the down counters 16 of $16AN_4$ and $16AN_6$ (not shown) corresponding to the analog input terminals $AN_4$ and $AN_6$ as shown in pattern P41, the written information is supplied to the A/D control circuit 2. The A/D control circuit 2 outputs the selection signal $S_{SL2}$ so that the down counters 16 of $16AN_4$ and $16AN_6$ corresponding to the analog input terminals $AN_4$ and $AN_6$ are selected and "1" is written into bit $b_4$ and $b_6$ of the scan selection flag register 9. Furthermore, the state where the count termination signals from these down counters 16 are input into the scan selection flag register 9 is established.

At the same time as the operation of the selector 15, the selector 17 operates so that the A/D interrupt signal $S_A$ can be supplied to the down counters 16 of $16AN_4$ and $16AN_6$ corresponding to the analog input terminals $AN_1$ and $AN_6$. As a result, in the next and following scan loops, the selector 8 scans the analog input terminals $AN_4$, $AN_6$, $AN_0$, $AN_1$, and $AN_2$ to form a scan loop of $AN_4$–$AN_6$–$AN_0$–$AN_1$–$AN_2$ as shown in pattern P42, and the scanned analog voltage is converted into a digital value. In response to the A/D interrupt signal $S_A$ which is generated each time one cycle of the scan loop is completed, the preset values of the down counters 16 of $16AN_4$ and $16AN_6$ corresponding to the analog input terminals $AN_4$ and $AN_6$ are decremented.

In the case where the preset values x and y have the relationship of x<y, when x cycles of the scan loop are completed, "0" is written into bit $b_4$ of the scan selection flag register 9 as shown in pattern P43 in response to the count termination signal which is output when the value of the down counter 16 corresponding to the analog input terminal $AN_4$ become "0". Then the selectors 15 and 17 corresponding to the analog input terminal $AN_4$ are set to be the nonselection state so that a scan loop of $AN_6$–$AN_0$–$AN_1$–$AN_2$ is formed. The scan operation of the scan loop is repeated.

When the seen loop is thereafter conducted y cycles, the value of the down counter 16 of $16AN_6$ corresponding to the analog input terminal $AN_6$ become "0" as shown in pattern P44, and "0" is written into bit $b_6$ of the scan selection flag register 9 as shown in pattern P45. This cancels the state of selecting analog voltages of desired channels which is established by the temporary conversion request, whereby the digital conversion of analog voltages due to the temporary conversion request is terminated.

Then the values of all the down counters 16 of $16AN_0$–$16AN_7$ corresponding to the analog input terminals $AN_0$–$AN_7$ become "0", and all the selectors 15 and 17 corresponding to the analog input terminal $AN_0$–$AN_7$ are set to be the nonselection state. Thereafter, the scan operation is returned to the scan loop of $AN_0$–$AN_1$–$AN_2$ according to the data written into the scan selection flag register 9, and the scan operation of the scan loop is repeated.
Embodiment 5

Figure 12:
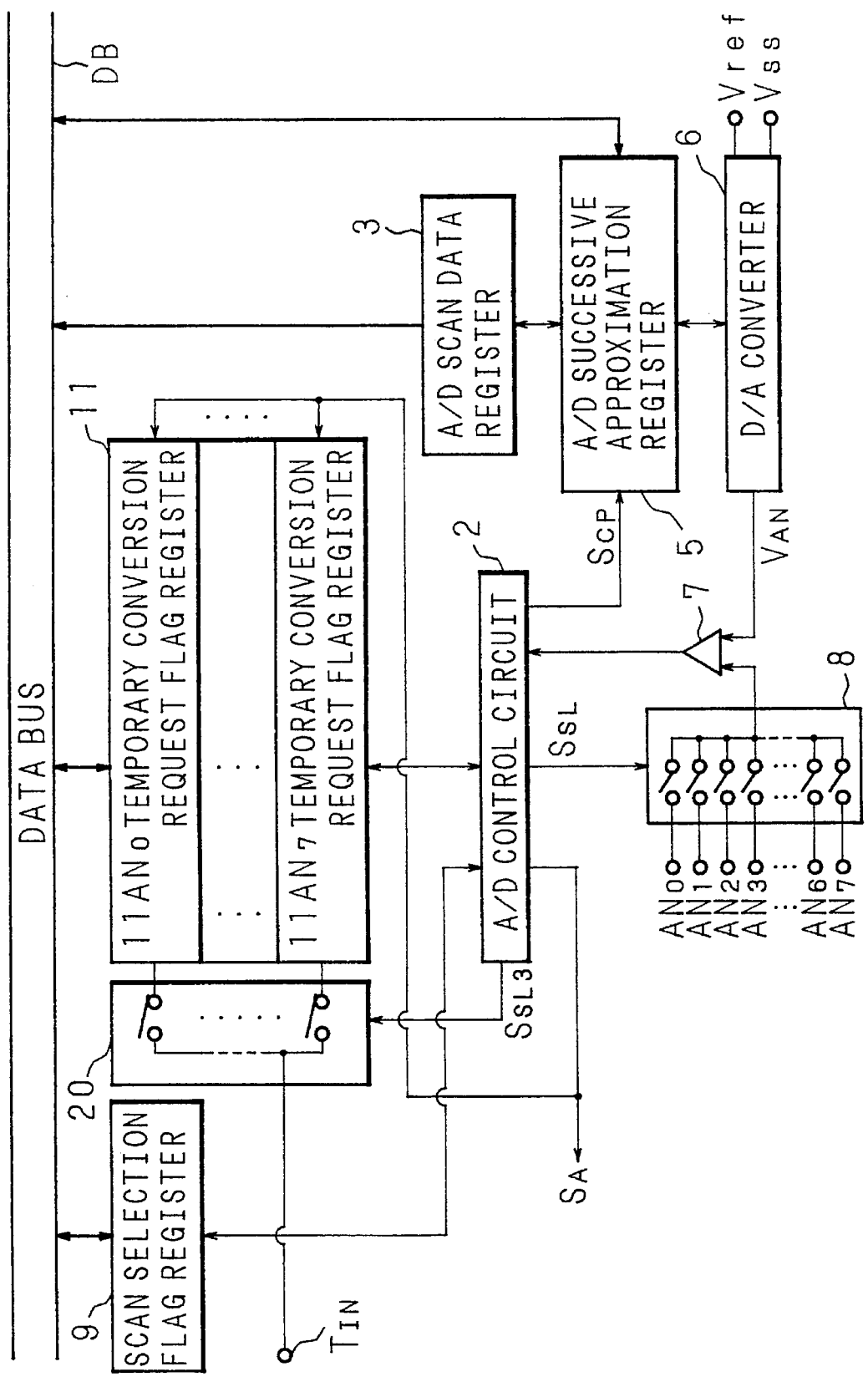
FIG. 12 is a block diagram showing the configuration of Embodiment 5 of the analog/digital converter according to the invention.

FIG. 12 is a block diagram showing the configuration of Embodiment 5 of the analog/digital converter according to the invention.

Temporary conversion request flag registers 11 of $11AN_0$–$11AN_7$ which respectively correspond to analog input terminals $AN_0$–$AN_7$ are connected to a data bus DB, and also to an A/D control circuit 2. The temporary conversion request flag registers 11 are connected to an external signal input terminal $T_{IN}$ through a selector 20 which respectively corresponds to the analog input terminals $AN_0$–$AN_7$. A selection signal $S_{SL3}$ output from the A/D control circuit 2 is supplied to the selector 20. The other configuration is the same as that of FIG. 8 excluding the down counter 13. The same components are designated by the same reference numerals and their description is omitted.

Next, the operation of the analog/digital converter will be described.

The conversions conducted by the A/D successive approximation register 5, the D/A converter 6, and the like are the same as those conducted in the converter of FIG. 4.

When the CPU writes "1" into selected bits of the scan selection flag register 9, a selection signal $S_{SL}$ corresponding to the bits into which "1" is written is supplied to the selector 8. The selector 8 scans the analog voltage corresponding to the bits of the scan selection flag register 9 into which "1" is written, to form a scan loop, and the scan operation is repeated.

When, during the execution of such a scan operation, the A/D control circuit 2 is disposed to control the reception mode for receiving an external trigger, the selection signal $S_{SL3}$ for selecting temporary conversion request flag registers 11 into which "1" is to be written is supplied to the selector 20 so that the selector 20 is set to be the selection state, whereby the external signal input terminal TIN is connected to the temporary conversion request flag registers 11 into which "1" is to be written.

When a trigger signal is given to the external signal input terminal TIN under this condition, "1" is written into the temporary conversion request flag registers 11 which are selected by the selector 20. In the next scan loop after one cycle of the current scan operation is completed, the analog voltages corresponding to the temporary conversion request flag registers 11 into which "1" is written are scanned, and a scan loop consisting of the analog voltages selected in the previous scan loop and those selected in accordance with the temporary conversion request is formed. The analog voltages corresponding to the temporary conversion request flag registers 11 into which "1" is written are temporarily converted into digital values.

When one cycle of the scan loop is completed, the A/D interrupt signal $S_A$ is supplied to the temporary conversion request flag registers 11. Therefore, the temporary conversion request flag registers 11 are reset, and the scan operation is returned to that of the scan loop formed before the temporary conversion request is issued.

As described above, when a signal is given to the external signal input terminal TIN during the execution of a scan operation, data is written into the temporary conversion request flag registers 11. Analog voltages are temporarily scanned in accordance with the data of the temporary conversion request flag registers 11, and a conversion is conducted only one time to convert the analog voltages into digital values of a given bit number.

Alternatively, down counters may be used in place of the temporary conversion request flag registers 11. Also in this alternative, analog voltages can be converted into digital values in the same manner.

Embodiment 6

Figure 13:
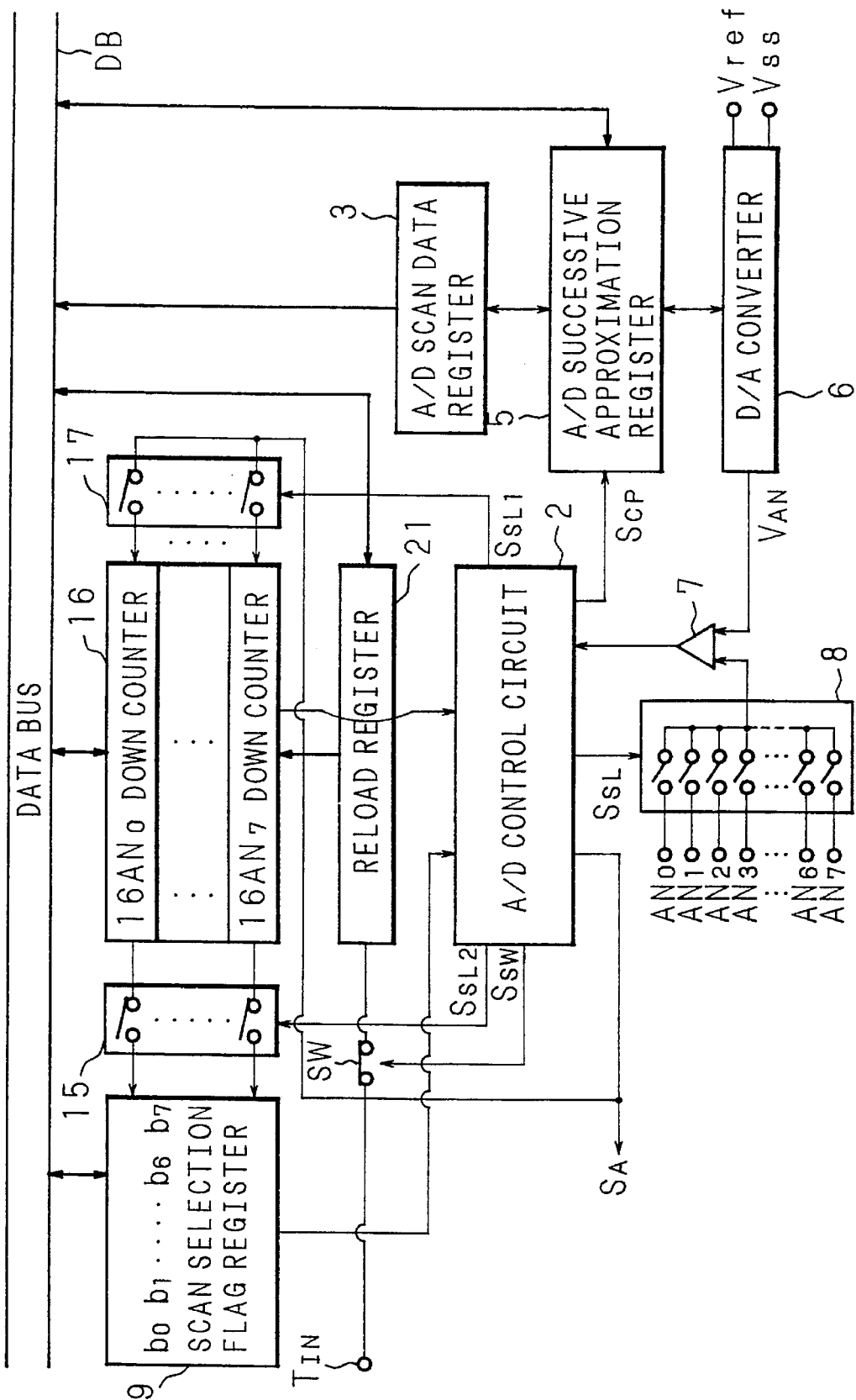
FIG. 13 is a block diagram showing the configuration of Embodiment 6 of the analog/digital converter according to the invention.

FIG. 13 is a block diagram showing the configuration of Embodiment 6 of the analog/digital converter according to the invention.

A reload register 21 is connected to a data bus DB, and also to an external signal input terminal $T_{IN}$ through a switch circuit SW. Data of the reload register 21 are coupled in such a manner they are transferred to down counters 16 of $16AN_0$–$16AN_7$ corresponding to analog input terminals $AN_0$–$AN_7$. An A/D interrupt signal $S_A$ output from an A/D control circuit 2 is supplied to the down counters 16.

The other configuration is the same as that of FIG. 10. The same components are designated by the same reference numerals and their description is omitted.

Next, the operation of the analog/digital converter will be described.

The conversions conducted by the A/D successive approximation register 5, the D/A converter 6, and the like are the same as those conducted in the converter of FIG. 4.

In accordance with data written into the scan selection flag register 9, predetermined ones of the analog input terminals $AN_0$–$AN_7$ are scanned, whereby a scan loop is formed. In the manner described above, a scan operation is conducted, and the scanned analog voltage is converted into a digital value.

The number of cycles for repeating a scan loop is previously written into the reload register 21. When a temporary conversion request for temporarily converting an analog voltages is issued, the A/D control circuit 2 sends a switch close signal $S_{SW}$ to the switch circuit SW so that the switch circuit SW is closed.

The selection signal $S_{SL2}$ is supplied to the selector 15, and the selector 15 connected to predetermined down counters 16 corresponding to the analog voltages which are to be in temporarily converted into digital values is set to be the selection state. When a trigger signal is given to the external signal input terminal $T_{IN}$, the trigger signal is sent to the reload register 21 so that the data of the reload register 21 are transferred to the down counters 16 of $16AN_0$–$16AN_7$ corresponding to the analog input terminals $AN_0$–$AN_7$. Then "1" is written into predetermined bits of the scanselection flag register 9 through the selector 15 which is in the selection state.

In accordance with the data written into the predetermined bits of the scan selection flag register 9, the selector selects the new analog voltage and scans it. A new scan loop is formed, and a scan operation is conducted to convert the scanned analog voltage into a digital value. In response to the A/D interrupt signal $S_A$ which is generated each time one cycle of the scan loop is completed, the preset value of the down counter 16 is decremented. When the value of the down counter 16 is reduced to "0", the data of the scan selection flag register 9 written in accordance with the temporary conversion request are cleared, and the temporary conversion request is canceled. The scan operation is returned to that of the scan loop formed before the temporary conversion request is issued.

As described above, in response to an external signal, data of the reload register can be transferred to the down counters and written into the scan selection flag register. Depending on the value of the down counter, the number of repeating a scan loop for temporarily scanning analog voltages can be selected.

Embodiment 7

Figure 14:
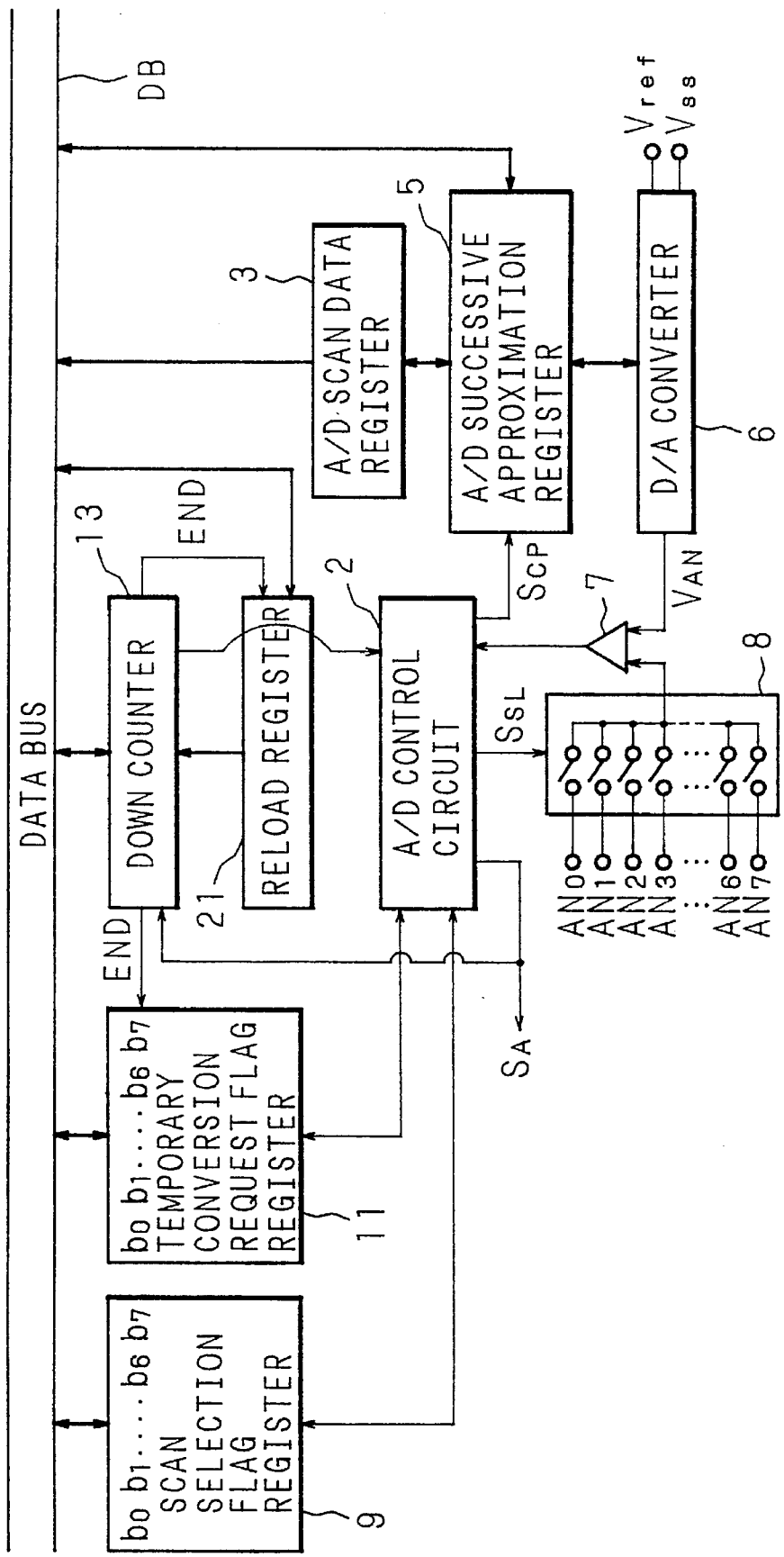
FIG. 14 is a block diagram showing the configuration of Embodiment 7 of the analog/digital converter according to the invention.

FIG. 14 is a block diagram showing the configuration of Embodiment 7 of the analog/digital converter according to the invention.

A down counter 13 is connected to a data bus DB. A count termination signal END from the down counter 13 is supplied to a reload register 21. The reload register 21 is connected to the data bus DB so that data can be written into and read out from the register.

The reload register 21 is connected also to the down counter 13 so that data of the register can be transferred to the down counter 13. The down counter 13 supplies a count termination signal END to a temporary conversion request flag register 11. The temporary conversion request flag register 11, and a scan selection flag register 9 are connected to the data bus DB, and also to the A/D control circuit 2. The other configuration is the same as that shown in FIG. 6 excluding the scan selection flag register 9, the temporary conversion request flag register 11, and the A/D control circuit 2. The same components are designated by the same reference numerals and their description is omitted.

Next, the operation of the analog/digital converter will be described.

The conversions conducted by the A/D successive approximation register 5, the D/A converter 6, and the like are the same as those conducted in the converter of FIG. 4. The analog voltage of the desired channel is selected by the selection signal $S_{SL}$ which is output from the A/D control circuit 2 in accordance with data of the scan selection flag register 9. A scan loop is formed, and a scan operation is conducted to convert the scanned analog voltage into a digital value.

When a data is written into the temporary conversion request flag register 11 in response to a temporary conversion request, the analog voltage selected by the temporary conversion request is scanned in the next scan loop after one cycle of the current scan operation is completed, and the analog voltage which is to be temporarily converted is converted into a digital value. When the scan loop has been repeated by the number which is preset in the down counter 13, the value of the down counter 13 is reduced to "0", the count termination signal END from the down counter 13 is supplied to the temporary conversion request flag register 11 and the reload register 21. The data of the temporary conversion request flag register 11 are cleared, and the operation of scanning the analog voltages according to the temporary conversion request is stopped. The scan operation is returned to that of the scan loop voltages can be selected.

Embodiment 7

FIG. 14 is a block diagram showing the configuration of Embodiment 7 of the analog/digital converter according to thereafter the scan loop of scanning analog voltages which are to be temporarily converted is repeated by the number which is transferred and preset in the down counter 13. In response to the issuance of the temporary conversion request, therefore, analog volt.ages which are to be temporarily converted can be scanned by the number corresponding to the data of the reload register 21. Furthermore, since the data of the reload register 21 is transferred to the down counter 13, the CPU is not required to conduct the process of writing the data into the down counter 13, whereby the load of the CPU can be reduced.

As described above in detail, according to the invention, analog voltages of plural channels can adequately be scanned to be converted into digital values, and the number of scan loops in which the scan operation completes one cycle can be selected.

In the course of continuously conducting the scan operation, moreover, desired analog voltages can temporarily be scanned to be converted into digital values.

Furthermore, the number of scanning analog voltages to be temporarily scanned can be selected, and the number of temporarily scanning analog voltages can be selected for each of analog voltages of different channels.

Furthermore, the invention can attain excellent effects such as that analog voltages can temporarily be scanned in accordance with an external signal, that the number of repeating a scan loop can be set in a counter in accordance with an external signal and the number of temporarily scanning analog voltages can be selected, and that the number of temporarily scanning analog voltages can be set in a counter without conducting a control by a CPU.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An analog/digital converter in which analog voltages of plural channels are cyclically scanned and given to a comparator, and each of the analog voltages is converted into a digital value, comprising:

a first register which stores data relating to a scan operation for each of the channels corresponding to said plural channels, and which indicates the channel of analog voltage to be scanned;

a second register which stores data relating to a scan operation for each of the channels corresponding to said plural channels, and which indicates the channel of analog voltage to be temporarily converted;

a selector to which said analog voltages of said plural channels are supplied, and which selects an analog voltage in accordance with instruction from said first and second registers and sequentially outputs said selected analog voltage to said comparator; and an analog/digital control circuit which controls said selector to repeatedly output the analog voltage indicated by said first register, and which, when data is written into the second register, controls said selector to add the analog voltage indicated by said second register to the analog voltage indicated by said first register upon completion of a scanning cycle controlled by said first register and at the beginning of the next scanning cycle.

2. An analog/digital converter in which analog voltages of plural channels are cyclically scanned and given to a comparator, and each of the analog voltages is converted into a digital value, comprising:

a first register which stores data relating to a scan operation for each of the channels corresponding to said plural channels, and which indicates the channel of analog voltage to be scanned;

a second register which stores data relating to a scan operation for each of the channels corresponding to the plural channels, and which indicates the channel of analog voltage to be temporarily converted;

a selector to which said analog voltages of plural channels are supplied, and which selects an analog voltage in accordance with instruction from said first and second registers and sequentially outputs said selected analog voltage to said comparator;

a counter which is set to count a predetermined number of scanning cycles of the analog voltage to be selected by said second register; and an analog/digital control circuit which stops an output from said selector of the analog voltage indicated by said second register when a value of said counter reaches said predetermined value.

3. An analog/digital converter in which analog voltages of plural channels are cyclically scanned and given to a comparator, and each of the analog voltages is converted into a digital value, comprising:

a register which stores data relating to a scan operation for each of the channels corresponding to said plural channels, and which indicates the channel of analog voltage to be scanned;

a selector to which said analog voltages of plural channels are supplied, and which selects an analog voltage in accordance with instruction from said register and sequentially outputs said selected analog voltage to said comparator;

a plurality of counters, each of which stores data relating to a scan operation for one of the channels corresponding to said plural channels, each counter being set to count a predetermined number of scanning cycles of one analog voltage to be temporarily converted; and an analog/digital control circuit which stops an output from said selector of said one analog voltage indicated by said register when a value of said counter reaches said predetermined value.

4. An analog/digital converter in which analog voltages of plural channels are cyclically scanned and given to a comparator, and each of the analog voltages is converted into a digital value, comprising:

a first register which stores data relating to a scan operation for each of the channels corresponding to said plural channels, and which indicates the channel of analog voltage to be scanned;

a second register which stores data relating to a scan operation for each of the channels corresponding to said plural channels, and which indicates the channel of analog voltage to be temporarily converted;

a selector to which said analog voltages of plural channels are supplied, and which selects an analog voltage in accordance with instruction from said first and second registers and sequentially outputs said selected analog voltage to said comparator;

a signal input terminal which is connected to said second register, and which inputs a signal indicative of the storing of said data to said second register; and an analog/digital control circuit which controls said selector to repeatedly output the analog voltage indicated by said first register, and which, when data is written into the second register, controls said selector to add the analog voltage indicated by said second register to the voltage indicated by said first register upon completion of a scan cycle controlled by said first register and at the beginning of the next scan cycle.

5. An analog/digital converter in which analog voltages of plural channel are cyclically scanned and given to a comparator, and each of the analog voltages is converted into a digital value, comprising:

a register which stores data relating to a scan operation for each of the channels corresponding to said plural channels, and which indicates the channel of analog voltage to be scanned;

a selector to which said analog voltages of plural channels are supplied, and which selects an analog voltage in accordance with instruction from said register and sequentially outputs said selected analog voltage to said comparator;

a plurality of counters, each of which stores data relating to a scan operation for one of the channels corresponding to said plural channels, each counter being set to a predetermined number of scanning cycles of one analog voltage to be temporarily converted;

a reload register which, when a signal is input, transfers data to said plurality of counters;

a signal input terminal which is connected to said reload register, and which inputs a signal indicative of the storing of said data to said reload register; and an analog/digital control circuit which stops an output from said selector of said one analog voltage indicated by said register when a value of said counter reaches said predetermined value.

6. An analog/digital converter in which analog voltages of plural channels are cyclically scanned and given to a comparator, and each of the analog voltages is converted into a digital value, comprising:

a first register which stores data relating to a scan operation for each of the channels corresponding to said plural channels, and which indicates the channel of analog voltage to be scanned;

a second register which stores data relating to a scan operation for each of the channels corresponding to the plural channels, and which indicates the channel of analog voltage to be temporarily converted;

a selector to which said analog voltages of plural channels are supplied, and which selects an analog voltage in accordance with instruction from said first and second registers and sequentially outputs said selected analog voltage to said comparator;

a reload register which, when a signal is input, transfers data stored in itself;

a counter which is set to count a predetermined number of scanning cycles of the analog voltage to be selected by said second register and which, when a count value reaches the predetermined number, inputs a signal to said reload register; and an analog/digital control circuit which controls said selector to repeatedly output the analog voltage indicated by said first register, and which, when a value of said counter reaches the predetermined number, stops an output of the analog voltage indicated by said second register, from said selector.

* * * * *